United States Patent
Suzuki et al.

[11] Patent Number: 6,140,583
[45] Date of Patent: *Oct. 31, 2000

[54] LEAD MEMBER WITH MULTIPLE CONDUCTIVE LAYERS AND SPECIFIC GRAIN SIZE

[75] Inventors: Satoshi Suzuki; Morimasa Tanimoto, both of Tochigi, Japan

[73] Assignee: The Fururakawa Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/864,339

[22] Filed: May 28, 1997

[30] Foreign Application Priority Data

Jun. 13, 1996 [JP] Japan ................... 8-151980

[51] Int. Cl.[7] ............................................ H05K 1/00
[52] U.S. Cl. ........................ 174/68.1; 174/250; 257/690
[58] Field of Search ................... 174/68.1, 250, 174/267; 361/771, 772, 773, 774, 776; 257/690, 692, 693, 694, 695, 697, 696

[56] References Cited

U.S. PATENT DOCUMENTS 5,583,379  12/1996  Sato et al. ...................... 257/736
5,635,755  3/1997  Kinghorn ........................ 257/666

FOREIGN PATENT DOCUMENTS 60-217693  10/1985  Japan .

*Primary Examiner*—Jeffrey Gaffin
*Assistant Examiner*—Kamand Cuneo
*Attorney, Agent, or Firm*—Frishauf, Holtz, Goodman, Langer & Chick, P.C.

[57] ABSTRACT

A lead member for electronic parts which has excellent heat resistance, oxidation resistance and corrosion resistance and is especially excellent in solderability and a process of producing such a lead member at low cost by plating are provided. The lead member comprises a base, at least a surface region of which is made of Cu or a Cu alloy, a primary coat of Ni, Co, a Ni alloy or a Co alloy and a surface layer of Pd, Ru, a Pd alloy or a Ru alloy formed sequentially on the base in the order mentioned. The primary coat consists of grains having a grain size of 20 $\mu$m or more.

18 Claims, 1 Drawing Sheet

LEAD MEMBER WITH MULTIPLE CONDUCTIVE LAYERS AND SPECIFIC GRAIN SIZE

BACKGROUND OF THE INVENTION

1. Field of the Invention

The present invention relates to a lead member for electronic parts, such as lead wire, which is used to connect various electronic parts, for example, semiconductor devices, to external circuits, and a process of producing such a lead member. More particularly, the present invention relates to an inexpensive lead member for electronic parts which has good heat resistance, good oxidation resistance and good corrosion resistance and thus is excellent in solderability, and a process of producing such a lead member.

2. Description of the Related Art

Various semiconductor devices such as diodes, transistors and ICs and various electronic parts, such as capacitors and resistors, incorporating such semiconductor devices have lead sections at which the devices or parts are connected to terminal sections of printed boards, for example. The lead section of an electronic part and the terminal section of a printed board are electrically connected to each other by lead members, such as lead wire as a typical example. The connection is usually achieved by soldering.

Conventionally, as such lead wire, a wire made of Cu alone or of a Cu alloy such as a Cu—Fe alloy or a Cu—Sn alloy, or a wire being a Cu-coated steel wire plated with Au, Ag, Sn, Ni or a Sn—Pb alloy is usually used.

The material used to make the lead wire is suitably selected depending on the electronic parts to which the lead wire is to be connected.

For electronic parts of which the major requirement is to maintain the mechanical strength after the connection, for example, a wire made of a Cu alloy or a Cu-coated steel wire is used. On the other hand, for electronic parts of which the major requirement is to secure the electrical conductivity, a Cu wire is used.

In the case of electronic parts which are subjected to etching during the manufacturing process, materials having corrosion resistance to the etchant used in the etching step are selected. Where electronic parts are subjected to heat treatment such as welding, soldering, cure molding or aging, materials having heat resistance and oxidation resistance are selected.

For example, a Si chip is subjected to etching using a strong acid or a strong alkali, and to connect a lead wire to the Si chip, the lead wire is soldered to the Si chip at a temperature as high as 350 to 400° C. Further, when the resulting device is cure-molded using a silicone resin, it is applied with heat for curing in air at a temperature of 200 to 250° C. In such a case, it is essential that the lead wire should have heat resistance, oxidation resistance and corrosion resistance.

As a lead wire for use with such a Si chip which is exposed to the aforementioned environmental conditions, a Ag-plated lead wire is currently known which includes a core made of oxygen-free copper containing Ag, a primary coat of Ni or a Ni alloy covering the surface of the core, and a Ag plate layer as a surface layer formed over the primary coat.

In this Ag-plated lead wire, Ag forming the surface layer has all of heat resistance, oxidation resistance and corrosion resistance, but Ag itself is expensive and migration is liable to occur. In addition, when the lead wire is heated at high temperatures in air, oxygen diffuses through the surface layer (Ag) and oxidizes the primary coat, with the result that the solderability lowers.

To solve the problems associated with the Ag-plated lead wire, a lead wire whose surface layer is made of Pd or a Pd alloy, instead of Ag, has been proposed (see Unexamined Japanese Patent Publication (KOKAI) No. 60-217693).

The surface layer of Pd or Pd alloy has excellent heat resistance, oxidation resistance and corrosion resistance and is also advantageous in that, unlike Ag, migration does not occur.

However, this conventional lead wire also is expensive because the material of the surface layer is Pd or a Pd alloy. To reduce the cost, the surface layer may be formed as thin as possible. If the surface layer is too thin, however, the solderability lowers at the time of heat treatment, as in the case of the Ag plate surface layer.

Thus, in order to enhance the solderability, the surface layer made of Pd or a Pd alloy must be increased in thickness, and this, however, leads to an increase in the cost of the lead wire.

The inventors hereof diligently conducted research to solve the problem of lowering of the solderability of the surface layer at the time of soldering and arrived at the following knowledges.

According to the knowledge of the inventors, when a lead wire is heated at the time of soldering, the metallic component constituting the surface region of the base of the lead wire, for example, the Cu component, thermally diffuses through grain boundaries of the metal forming the primary coat or through pinholes within the grain boundaries and contaminates the surface layer, and as a consequence, the solderability of the surface layer lowers.

Based on the above knowledge, the inventors gained the following technical concept; that is, if the grain size of the metal constituting the aforementioned primary coat grows larger to thereby reduce the number of the grain boundaries, then the thermal diffusion of the metallic component into the surface layer from the surface region of the base can be suppressed, so that the surface layer is prevented from being contaminated and the solderability thereof does not lower.

The present invention was created based on this technical concept.

OBJECTS AND SUMMARY OF THE INVENTION

One object of the present invention is to provide a lead member for electronic parts which is excellent in heat resistance, oxidation resistance and corrosion resistance and of which the solderability does not lower even if the surface layer thereof is reduced in thickness.

Another object of the present invention is to provide a process of producing a lead member for electronic parts at low cost, which lead member is excellent in heat resistance, oxidation resistance and corrosion resistance and also has excellent solderability.

To achieve the above objects, the present invention provides a lead member for an electronic part, comprising: a base, at least a surface region of which is made of Cu or a Cu alloy; a primary coat formed on the surface of the base, the primary coat being made of one selected from the group consisting of Ni, Co, Ni alloys and Co alloys; and a surface layer formed on the surface of the primary coat, the surface layer being made of one selected from the group consisting of Pd, Ru, Pd alloys and Ru alloys, wherein the primary coat consists of grains having a grain size of 20 μm or more, and also provides a process of producing a lead member for an electronic part, comprising the steps of: subjecting a base, at least a surface region of which is made of Cu or a Cu alloy, to heat treatment to thereby control the grain size of the Cu or the Cu alloy to 20 μm or more; plating the heat-treated surface region with one of Ni, Co, Ni alloys and Co alloys, to form a primary coat; and plating the primary coat with one of Pd, Ru, Pd alloys and Ru alloys, to form a surface layer.

DETAILED DESCRIPTION OF THE INVENTION

Figure 1:
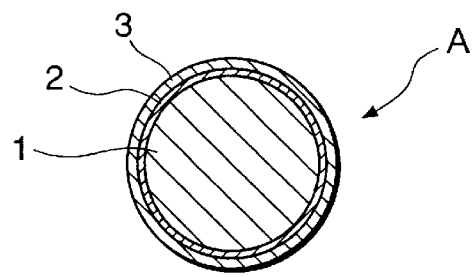
FIG. 1 is a sectional view of a lead member A according to one embodiment of the present invention.

FIG. 1 is a sectional view showing a lead member A, or more specifically, a lead wire, according to one embodiment of the present invention.

The lead member A comprises a base 1, a primary coat 2 covering the surface of the base 1, and a surface layer 3 formed over the primary coat 2.

The base 1 may be made of Cu in its entirety or of a Cu alloy. Alternatively, the base 1 may comprise, for example, a steel wire plated with Cu or a Cu alloy so that the surface region of the steel wire is formed by the Cu or the Cu alloy only.

The Cu alloy used may be a Cu—Zn alloy, a Cu—Sn alloy, a Cu—Ag alloy, or a Cu—Ni alloy, for example.

The primary coat 2 is formed over the surface of the base 1. This primary coat 2 serves to prevent the metallic elements of the base 1, which thermally diffuse from the base during the application of heat for soldering, from reaching and contaminating the surface layer, mentioned later.

More specifically, the primary coat 2 is a layer of which the composition is Ni, Co, a Ni alloy such as Ni—Co alloy, Ni—Fe alloy, Ni—Sn alloy or Ni—Zn alloy, or a Co alloy such as Co—Zn alloy, Co—Ni alloy, Co—Sn alloy or Co—Ag alloy, and of which the grain size is 20 μm or more.

If the grain size is smaller than 20 μm, the number of grain boundaries in the primary coat 2 increases and the number of pinholes within the grain boundaries also increases. Accordingly, diffusion of the metal from the base 1 into the surface layer cannot be effectively suppressed, with the result that the surface layer is contaminated and the solderability thereof lowers. Preferably, the grain size in the primary coat 2 is 50 to 100 μm.

Usually, the primary coat 2 is formed by subjecting the base 1 to a plating process. The grain size of the plate layer formed at this time over the base 1 can be adjusted by subjecting the base to annealing and controlling the size of grains recrystallized in the surface region of the base, as described later.

The surface layer 3 is formed so as to cover the primary coat 2. This surface layer 3 is formed by plating the primary coat 2 with Pd, Ru, a Pd alloy such as Pd—Ni alloy or Pd—P alloy, or a Ru alloy such as Ru—Ni alloy.

The metal constituting the surface layer 3 is migration-free and is excellent in heat resistance, oxidation resistance and corrosion resistance; therefore, the lead member having such a surface layer is free from migration and has excellent heat resistance, oxidation resistance and corrosion resistance.

The constituent metal of the surface layer 3 is very expensive, and accordingly, the thickness of the surface layer should be as small as possible in order to provide inexpensive lead members. According to the present invention, because of the function of the aforementioned primary coat 2, the solderability does not lower if the thickness of the surface layer 3 is reduced to about 0.02 μm.

The lead member A can be produced in the following manner.

First, the base 1 is prepared and is then subjected to a plating process known in the art to form the primary coat 2 over the surface of the base 1.

In this case, to make the grain size in the primary coat 2 greater than or equal to 20 μm, the treatment described below is carried out.

The base 1 is annealed in a non-oxidizing atmosphere. Specifically, the base 1 is heated for a predetermined period of time in a furnace with non-oxidizing gaseous atmosphere. In this case, where the heating temperature is varied with the heat treatment time fixed, the size of crystal grains in the surface region of the base 1 grows larger as the treating temperature rises, and as a consequence, the grain size in the primary coat deposited on these above mentioned crystal grains in the surface region of the base also grows to be large.

For example, in the case where the base 1 is annealed at 400° C., the grain size of the primary coat plated on the base is approximately 20 μm, and where the base 1 is annealed at 600° C., the grain size of the primary coat is approximately 80 μm.

Thus, by controlling the annealing temperature of the base 1, it is possible to adjust the size of crystal grains in the primary coat 2.

The thickness of the primary coat 2 is not particularly limited. However, if the primary coat 2 is too thin, the effect of suppressing the thermal diffusion of metallic components from the base 1 diminishes, and if the primary coat is too thick, it is liable to peel off from the base 1 due to increased strain of the plate. Preferably, therefore, the thickness of the primary coat 2 is about 0.1 to 2.0 μm.

The primary coat 2 formed in this manner is plated, and the surface layer 3 is formed, thereby obtaining the lead member A according to the present invention.

If the surface layer 3 is too thin, the number of pinholes increases and also the surface area of exposure of the primary coat 2 increases, posing a problem in that the solderability lowers. On the other hand, if the surface layer 3 is too thick, the manufacturing cost increases. Accordingly, the thickness of the surface layer 3 is preferably controlled to about 0.01 to 0.4 μm.

Figure 2:
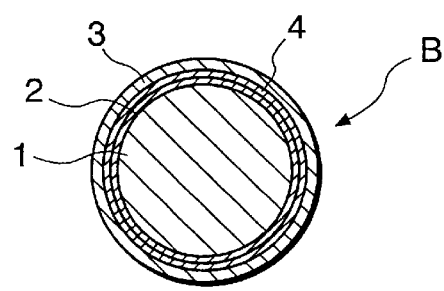
FIG. 2 is a sectional view of a lead member B according to another embodiment of the present invention.

FIG. 2 is a sectional view showing a lead member B according to another embodiment of the present invention.

This lead member B has a layer structure identical with that of the lead member A, except that an intermediate layer 4, mentioned below, is formed between the surface layer 3 and the primary coat 2.

The intermediate layer 4 is a plate layer made of a Ni—P alloy, a Ni—B alloy, a Co—P alloy, a Co—B alloy, a Ni—Co—P alloy or a Ni—Co—B alloy, and is more resistant to oxidation than the material comoposed of the primary coat 2.

In this lead member B, therefore, oxidation of the primary coat 2 is suppressed by the function of the intermediate layer 4, whereby lowering of the solderability of the lead member can be suppressed. The thickness of the intermediate layer 4 is not particularly limited. If the intermediate layer 4 is too thin, the above advantageous effect lessens, and if the intermediate layer is too thick, the characteristics of the lead member, for example, bendability, lower. To ensure the workability of the lead member as well as the effect of suppressing oxidation to the primary coat 2, therefore, the intermediate layer 4 preferably has a thickness of 0.01 to 0.5 $\mu$m.

Figure 3:
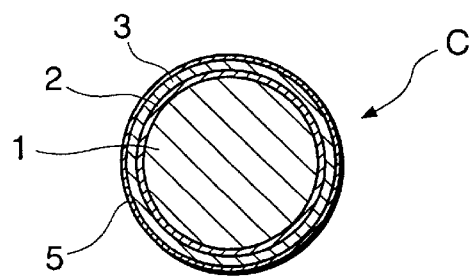
FIG. 3 is a sectional view of a lead member C according to still another embodiment of the present invention.

FIG. 3 is a sectional view showing a lead member C according to still another embodiment of the present invention.

This lead member C has a layer structure identical with that of the lead member A, except that an auxiliary layer 5, mentioned below, is formed over the surface layer 3.

The auxiliary layer 5 is a plate layer made of Au, Ag, Rh, Pt, Os, or Ir. These substances all have very excellent oxidation resistance; therefore, even if the auxiliary layer 5 is extremely thin, it can provide the effect of preventing the surface layer 3 from being oxidized, thereby suppressing lowering of the solderability of the lead member. If, however, the thickness of the auxiliary layer 5 is too small, the above advantageous effect lessens, and if the auxiliary layer is too thick, the manufacturing cost increases. To ensure the solderability and from the economical viewpoint, therefore, the auxiliary layer 5 preferably has a thickness of 0.001 to 0.1 $\mu$m.

Figure 4:
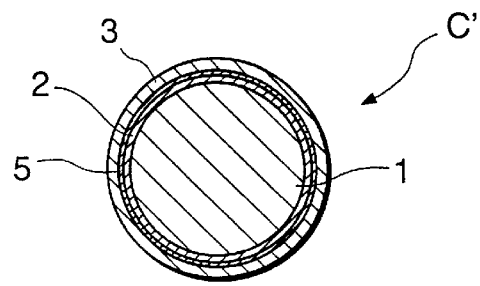
FIG. 4 is a sectional view of a lead member C' according to a further embodiment of the present invention.

FIG. 4 is a sectional view showing a lead member C' according to a further embodiment of the present invention.

This lead member C' is identical with the lead member C, except that the auxiliary layer 5 is formed immediately underneath the surface layer 3, that is, between the primary coat 2 and the surface layer 3.

In this lead member C', oxidation of the primary coat 2 is suppressed more effectively, so that the solderability of the lead member improves.

The auxiliary layer 5 may be formed over the surface layer 3 or between the surface layer 3 and the intermediate layer 4 of the lead member B shown in FIG. 2. Also in this case, the solderability of the lead member can be improved, as in the lead members C and C'.

EXAMPLES 1–9, COMPARATIVE EXAMPLES 1 & 2

Following the procedure described below, the lead members A were produced.

Oxygen-free copper wires each having a diameter of 0.6 mm were prepared as the bases. The oxygen-free copper wires were subjected to heat treatment (annealing) for 30 minutes in a tube furnace with gaseous, $N_2$-$H_2$ mixed atmosphere at temperatures shown in Table 1.

After subjecting the annealed oxygen-free copper wires to an ordinary pretreatment by means of a continuous plating line, the wires were passed successively through predetermined plating tanks to obtain lead wires with layer structures shown in Table 1. These lead wires had the layer structure identical with that of the lead member A shown in FIG. 1.

Subsequently, samples of 30 mm long were cut from the obtained lead wires, were subjected to a header machining, and were heated at a temperature of 200° C. in air for 8 hours. The samples were evaluated as to solderability, following the procedure specified below.

Evaluation of Solderability: Each sample was cleaned sufficiently using acetone and dipped for 5 seconds in a bath of molten solder having a eutectic point at 235° C., and the area of solder adhering to the surface of each sample was measured using a magnifying glass (about 15 magnifications) and was divided by the dipping area of the sample, to obtain the wet area in terms of percentage.

The larger the value of wet area, the higher solderability the sample has.

Also, the size of crystal grains in the primary coat formed over each oxygen-free copper wire was measured, following the procedure specified below.

Measurement of Grain Size of Primary Coat: Each primary coat was observed using a scanning electron microscope (magnifying power: 1000 to 100), and an average grain size was obtained.

The plating of the individual layers was carried out using the plating baths mentioned below and under the plating conditions also described below. The plating time was varied to thereby obtain different thicknesses of plate layers.

(1) Ni Plating

Plating Bath: 240 g/l $NiSO_4$, 45 g/l $NiCl_2$, and 30 g/l $H_3BO_3$. Plating Condition: Current density of 5 A/dm$^2$, and a bath temperature of 50° C.

(2) Co Plating

Plating Bath: 400 g/l $CoSO_4$, 20 g/l NaCl, and 40 g/l $H_3BO_3$. Plating Condition: Current density of 5 A/dm$^2$, and a bath temperature of 30° C.

(3) Ni—Co Plating

Plating Bath: 240 g/l $NiCO_4$, 45 g/l $NiCl_2$, 30 g/l $H_3BO_3$, and 15 g/l $CoSO_4$. (This plating bath permits the formation of a plate layer of a Ni-10% Co alloy.) Plating Condition: Current density of 5 A/dm$^2$, and a bath temperature of 55° C.

(4) Pd Plating

Plating Bath: 40 g/l $Pd(NH_3)_2Cl_2$, 90 ml/l $NH_4OH$, and 50 g/l $(NH_4)_2SO_4$. Plating Condition: Current density of 1 A/dm$^2$, and a bath temperature of 30° C.

(5) Ru Plating

Plating Bath: 10 g/l $RuNOCl_3 \cdot 5H_2O$, and 15 g/l $NH_2SO_3H$. Plating Condition: Current density of 1 A/dm$^2$, and a bath temperature of 60° C.

(6) Pd-20% Ni Alloy Plating

Plating Bath: 40 g/l $Pd(NH_3)_2Cl_2$, 45 g/l NiSO4, 90 ml/l $NH_4OH$, and 50 g/l $(NH4)_2SO_4$. Plating Condition: Current density of 1 A/dm$^2$, and a bath temperature of 30° C.

The results are collectively shown in Table 1.

TABLE 1

| | Annealing temp. for oxygen-free copper wire (° C.) | Layer structure | | | | | Solder-wetted area (%) |
|---|---|---|---|---|---|---|---|
| | | Primary coat | | | Surface layer | | |
| | | Plate type | Thickness (μm) | Grain size (μm) | Plate type | Thickness (μm) | |
| Example 1 | 400 | Ni | 0.5 | 20 | Pd | 0.02 | 74 |
| Example 2 | 500 | Ni | 0.5 | 40 | Pd | 0.02 | 78 |
| Example 3 | 600 | Ni | 0.5 | 80 | Pd | 0.02 | 83 |
| Example 4 | 650 | Co | 0.3 | 120 | Pd | 0.02 | 87 |
| Example 5 | 700 | Ni | 0.3 | 200 | Ru | 0.02 | 90 |
| Example 6 | 600 | Ni-10% Co | 0.5 | 80 | Pd-20% Ni | 0.02 | 80 |
| Example 7 | 600 | Ni | 0.3 | 80 | Ru | 0.05 | 92 |
| Example 8 | 600 | Ni | 0.5 | 80 | Pd | 0.005 | 72 |
| Example 9 | 600 | Ni | 0.5 | 80 | Pd | 0.1 | 94 |
| Compar. Example 1 | 200 | Ni | 0.3 | 8 | Pd | 0.02 | 25 |
| Compar. Example 2 | 300 | Ni-10% Co | 0.5 | 15 | Pd | 0.02 | 47 |

Table 1 reveals the following:

(1) Comparing Examples 1 to 6 with Comparative Example 1 clearly shows that, although their surface layers are each a Pd plate layer of 0.02 μm thick, the lead wires according to Examples 1 to 6 of the present invention have much greater solder-wetted areas and have improved solderability.

Considering the fact that the primary coats of Examples 1 to 6 have much greater grain size than that of Comparative Example 1, the results demonstrate that increasing the grain size in the primary coat is very effective in the improvement of the solderability of the lead wire.

(2) This is clear also from the fact that the solder-wetted area (%) increases with increase in the grain size in the primary coat (Examples 1–5).

(3) The results further reveal that, to increase the grain size in the primary coat, the oxygen-free copper wire should preferably be annealed prior to the formation of the primary coat by plating. Table 1 shows in particular that the oxygen-free copper wire should preferably be annealed for 30 minutes at a temperature of 40° C. or more.

EXAMPLES 10–13

Oxygen-free copper wires which had been annealed at 600° C. were plated to form respective primary coats shown in Table 2, then intermediate layers also shown in Table 2 were formed over the respective primary coats, and surface layers shown in Table 2 were formed to obtain lead wires B according to the present invention which had the layer structure shown in FIG. 2.

Following the same procedure as employed in Examples 1 to 9, the grain sizes of the primary coats and the solder-wetted areas (%) of the lead wires were measured. The results are collectively shown in Table 2.

The plating of the intermediate layers was carried out using the plating baths mentioned below and under the plating conditions also described below.

(1) Ni-3% B Plating

Plating Bath: 240 g/l $NiSO_4$, 45 g/l $NiCl_2$, 30 g/l $H_3BO_3$, and 3 g/l $(CH_3)_3NBH_3$. Plating Condition: Current density of 1 to 10 A/dm$^2$, and a bath temperature of 55° C.

(2) Ni-20% P Plating

Plating Bath: 240 g/l NiSO4, 15 g/l $NiCl_2$, 30 g/l $H_3BO_3$, and 32 g/l $H_3PO_3$. Plating Condition: Current density of 5 A/dm$^2$, and a bath temperature of 30° C.

(3) Ni—Co-3% B Plating

Plating Bath: 10 g/l $NiCl_2·6H_2O$, 45 g/l $CoCl_2·6H_2O$, 12 g/l $NH_4Cl$, 160 ml/l $NH_4OH$, 45 ml/l $(C_2H_5)_4NCl$, and 1 ml/l $NaBH_2$. Plating Condition: Chemical plating at a bath temperature of 45° C.

(4) Ni—Co-5% P Plating

Plating Bath: 15 g/l $NiSO_4·6H_2O$, 10 g/l $CoSO_4·7H_2O$, 84 g/l sodium citrate, 42 g/l $(NH_4)_2SO_4$, 14 ml/l $NH_4OH$, and 8 ml/l $H_3PO_2$. Plating Condition: Chemical plating at a bath temperature of 90° C.

TABLE 2

| | Layer structure | | | | | | | Solder-wetted area (%) |
|---|---|---|---|---|---|---|---|---|
| | Primary coat | | | Intermediate layer | | Surface layer | | |
| | Plate type | Thickness (μm) | Grain size (μm) | Plate type | Thickness (μm) | Plate type | Thickness (μm) | |
| Example 10 | Ni | 0.5 | 80 | Ni-3% B | 0.1 | Pd | 0.02 | 90 |
| Example 11 | Co | 0.3 | 80 | Ni-20% P | 0.1 | Pd | 0.02 | 89 |

TABLE 2-continued

| | Layer structure | | | | | | | |
|---|---|---|---|---|---|---|---|---|
| | Primary coat | | | Intermediate layer | | Surface layer | | Solder- |
| | Plate type | Thickness ($\mu$m) | Grain size ($\mu$m) | Plate type | Thickness ($\mu$m) | Plate type | Thickness ($\mu$m) | wetted area (%) |
| Example 12 | Ni | 0.5 | 80 | Ni—Co-3% B | 0.1 | Pd | 0.01 | 90 |
| Example 13 | Co | 0.3 | 80 | Ni—Co-5% P | 0.1 | Pd | 0.01 | 87 |

Comparison between the results shown in Table 1 and those shown in Table 2 clearly shows that, where the surface layers have the same thickness and also the primary coats are formed by the same grain size, those lead wires each of which has an intermediate layer formed between the primary coat and the surface layer exhibit larger solder-wetted areas.

This proves that the formation of the intermediate layer is effective in the enhancement of the solder wettability of the lead wire.

EXAMPLES 14–26

Oxygen-free copper wires which had been annealed at temperatures shown in Table 3 were formed sequentially with respective primary coats, surface layers and auxiliary layers also shown in Table 3, to obtain lead wires C according to the present invention which had the layer structure shown in FIG. 3. These lead wires obtained in this manner are referred to as Examples 14 to 19, respectively.

In Example 19, the intermediate layer shown in Table 3 was formed between the primary coat and the surface layer.

Also, lead wires C' according to the present invention, having the layer structure shown in FIG. 4, were produced in such a manner that the auxiliary layers shown in Table 3 were each present between the primary coat and the surface layer. These lead wires are referred to as Examples 20 to 26, respectively. In the case of Example 26, the intermediate layer shown in Table 3 was formed between the primary coat and the auxiliary layer.

The plating of the individual auxiliary layers was carried out using the plating baths mentioned below and under the plating conditions also described below.

(1) Au Plating
First, Au was struck in Plating Bath: N-200 from N.E.CHEMCAT CORPORATION, under Plating Condition: Current density of 2 A/dm$^2$ and a bath temperature of 25° C., and then Au was plated in Plating Bath: N-44 from N.E.CHEMCAT CORPORATION, under Plating Condition: Current density of 1 A/dm$^2$ and a bath temperature of 65° C.

(2) Ag Plating
First, Ag was struck in Plating Bath: 5 g/l AgCN, 60 g/l KCN, and 30 g/l K$_2$CO$_3$, under Plating Condition: Current density of 2 A/dm$^2$ and a bath temperature of 30° C., and then Ag was plated in Plating Bath: 50 g/l AgCN, 100 g/l KCN, and 30 g/l K$_2$CO$_3$, under Plating Condition: Current density of 1 A/dm$^2$ and a bath temperature of 30° C.

(3) Rh Plating
Plating Bath: RH#225 from N.E.CHEMCAT CORPORATION. Plating Condition: Current density of 1 A/dm$^2$, and a bath temperature of 55° C.

(4) Pt Plating
Plating Bath: 10 g/l Pt(NH$_3$)$_2$(NO$_2$)$_2$, 100 g/l NH$_4$NO$_3$, 10 g/l ammonium nitrite, and 55 ml/l NH$_4$OH. Plating Condition: Current density of 1 A/dm$^2$, and a bath temperature of 90° C.

(5) Os Plating
Plating Bath: 25 g/l K$_2$[Os(NO)(OH)(NO$_2$)$_4$]. Plating Condition: Current density of 2 A/dm$^2$, a bath temperature of 70° C., and pH of 12 to 13.

(6) Ir Plating
Plating Bath: INDEX 100 from EEJA. Plating Condition: Current density of 0.15 A/dm$^2$, and a bath temperature of 85° C.

Following the same procedure as employed in Examples 1 to 9, the individual lead wires produced in this manner were measured as to the grain size in the primary coat and the solderability of the entire structure. The results are collectively shown in Table 3.

TABLE 3

| | Annealing temp. for oxygen-free copper wire (° C.) | Layer structure | | | | | | | | | | | |
|---|---|---|---|---|---|---|---|---|---|---|---|---|---|
| | | Primary coat | | | Intermediate layer | | Auxiliary layer | | Surface layer | | Auxillary layer | | Solder-wetted area (%) |
| | | Plate type | Thickness ($\mu$m) | Grain size ($\mu$m) | Plate type | Thickness ($\mu$m) | Plate type | Thickness ($\mu$m) | Plate type | Thickness ($\mu$m) | Plate type | Thickness ($\mu$m) | |
| Example 14 | 650 | Co | 0.3 | 120 | — | — | — | — | Pd | 0.02 | Au | 0.002 | 96 |
| Example 15 | 700 | Ni | 0.3 | 200 | — | — | — | — | Ru | 0.02 | Ag | 0.01 | 95 |
| Example 16 | 600 | Ni-10% Co | 0.5 | 80 | — | — | — | — | Pd-2% Ni | 0.02 | Rh | 0.001 | 91 |

TABLE 3-continued

| | Annealing temp. for oxygen-free copper wire (° C.) | Primary coat | | | Intermediate layer | | Auxillary layer | | Surface layer | | Auxillary layer | | Solder-wetted area (%) |
|---|---|---|---|---|---|---|---|---|---|---|---|---|---|
| | | Plate type | Thickness (μm) | Grain size (μm) | Plate type | Thickness (μm) | Plate type | Thickness (μm) | Plate type | Thickness (μm) | Plate type | Thickness (μm) | |
| Example 17 | 600 | Ni | 0.3 | 80 | — | — | — | — | Ru | 0.02 | Pt | 0.001 | 93 |
| Example 18 | 600 | Ni | 0.5 | 80 | — | — | — | — | Pd | 0.02 | Os | 0.002 | 94 |
| Example 19 | 600 | Ni | 0.5 | 80 | Ni-3% B | 0.1 | — | — | Pd | 0.02 | Ir | 0.002 | 92 |
| Example 20 | 600 | Co | 0.3 | 80 | — | — | Au | 0.002 | Pd | 0.02 | — | — | 93 |
| Example 21 | 700 | Ni | 0.3 | 200 | — | — | Ag | 0.1 | Ru | 0.02 | — | — | 92 |
| Example 22 | 600 | Ni-10% Co | 0.5 | 80 | — | — | Rh | 0.001 | Pd-20% Ni | 0.02 | — | — | 88 |
| Example 23 | 600 | Ni | 0.3 | 80 | — | — | Pt | 0.001 | Ru | 0.02 | — | — | 91 |
| Example 24 | 600 | Ni | 0.5 | 80 | — | — | Re | 0.003 | Pd | 0.02 | — | — | 90 |
| Example 25 | 600 | Ni | 0.5 | 80 | — | — | Os | 0.002 | Pd | 0.02 | — | — | 93 |
| Example 26 | 600 | Ni | 0.5 | 80 | Ni-3% B | 0.1 | Ir | 0.002 | Pd | 0.02 | — | — | 92 |

As is evident from the comparison between the results shown in Table 3 and those shown in Table 1 or in Table 2, the lead wires each having an auxiliary layer formed outside or inside the surface layer have larger solder-wetted areas than those having no auxiliary layer. This proves that the formation of the auxiliary layer serves to enhance the solderability of the lead wire.

As described above, in the lead member for electronic parts according to the present invention, the grain size in the primary coat is made as large as 20 μm or more, that is, the grain boundaries which act as paths of diffusion of the constituents of the base are reduced in number, and therefore, the surface of the lead member is much less liable to be contaminated, thus providing excellent solderability. The primary coat having such a large grain size can be easily formed by plating a base having a large grain size with a primary coat. With the process according to the present invention, therefore, even in the case where a precious metal is used to form the surface layer, the thickness of the surface layer can be reduced. Consequently, it is possible to manufacture lead members with excellent solderability at low cost, and thus the industrial value of the present invention is remarkably high.

What is claimed is:

1. A lead member for an electronic part, comprising:
   a base, at least a surface region of which is made of Cu or a Cu alloy;
   a primary coat formed on the surface of said base, said primary coat being made of one selected from the group consisting of Ni, Co, Ni alloys and Co alloys; and
   a surface layer formed on the surface of said primary coat, said surface layer being made of one selected from the group consisting of Pd, Ru, Pd alloys and Ru alloys,
   wherein said primary coat consists of grains having a grain size of 20 μm or more.

2. A process of producing a lead member for an electronic party according to claim 1, comprising the steps of:
   subjecting a base, at least a surface region of which is made of Cu or a Cu alloy, to heat treatment to thereby control the grain size of the Cu or the Cu alloy to 20 μm or more;
   plating the heat-treated surface region with one of Ni, Co, Ni alloys and Co alloys, to form a primary coat; and
   plating the primary coat with one of Pd, Ru, Pd alloys and Ru alloys, to form a surface layer.

3. The lead member according to claim 1, which further comprises an auxiliary layer made of one selected from the group consisting of Au, Ag, Rh, Pt, Os and Ir and having a thickness of 0.001 to 0.1 μm being formed on said surface layer.

4. The lead member according to claim 1, which further comprises an auxiliary layer made of one selected from the group consisting of Au, Ag, Rh, Pt, Os and Ir formed immediately underneath said surface layer.

5. The lead member according to claim 1, which further comprises an intermediate layer made of one selected from the group consisting of Ni—P alloys, Ni—B alloys, Co—P alloys, Co—B alloys, Ni—Co—P alloys and Ni—Co—B alloys being formed between said primary coat and said surface layer.

6. The lead member according to claim 5, which further comprises auxiliary layer made of one selected from the group consisting of Au, Ag, Rh, Pt, Os and Ir and having a thickness of 0.001 to 0.1 μm being formed on said surface layer.

7. The lead member according to claim 5, which further comprises an auxiliary layer made of one selected from the group consisting of Au, Ag, Rh, Pt, Os and Ir being formed immediately underneath said surface layer.

8. The lead member according to claim 5, wherein the intermediate layer has a thickness of 0.01 to 0.5 μm.

9. The lead member according to claim 1, wherein the base is made of a Cu alloy selected from the group consisting of a Cu—Zn alloy, a Cu—Sn alloy, a Cu—Ag alloy and a Cu—Ni alloy.

10. The lead member according to claim 1, wherein the primary coat is made of an alloy selected from the group consisting of a Ni—Co alloy, a Ni—Fe alloy, a Ni—Sn alloy, a Ni—Zn alloy, a Co—Zn alloy, a Co—Ni alloy, a Co—Sn alloy and a Co—Ag alloy.

11. The lead member according to claim 1, wherein the grain size of the primary coat is 50 to 100 µm.

12. The lead member according to claim 11, wherein the primary coat has a thickness of 0.1 to 2.0 µm.

13. The lead member according to claim 12, wherein the surface layer has a thickness of 0.01 to 0.4 µm.

14. The lead member according to claim 1, wherein the surface layer is made of an alloy selected from the group consisting of a Pd—Ni alloy, a Pd—P alloy and a Ru—Ni alloy.

15. The lead member according to claim 1, wherein the base is a Cu alloy, the primary coat is Ni and the surface layer is Pd.

16. The lead member according to claim 1, wherein the primary coat is Co and the surface layer is Pd.

17. The lead member according to claim 1, wherein the primary coat is Ni and the surface layer is Ru.

18. The lead member according to claim 1, wherein the primary coat is Ni-10% Co and the surface layer is Pd-20% Ni.

* * * * *